Jan. 15, 1963 R. H. JENKINS 3,073,972
PULSE TIMING CIRCUIT
Filed May 10, 1961

INVENTOR.
ROBERT H. JENKINS
BY
Carl V. Olson
ATTORNEY

United States Patent Office 3,073,972
Patented Jan. 15, 1963

3,073,972

PULSE TIMING CIRCUIT

Robert H. Jenkins, Audubon, N.J., assignor to Radio Corporation of America, a corporation of Delaware Filed May 10, 1961, Ser. No. 109,154
7 Claims. (Cl. 307—88.5)

This invention relates to timing circuits capable of translating an input signal voltage transition to a delayed output signal voltage transition. More specifically, the invention relates to a stabilized timing circuit providing an output pulse having a leading edge which is delayed in time relative to the leading edge of an input pulse. While not limited thereto, the invention is particularly useful in the magnetic tape station and logic portions of electronic data processing apparatus.

It is an object of this invention to provide a timing circuit wherein an output voltage transition is delayed relative to an input voltage pulse transition by a stable, predetermined amount which is substantially unaffected by the amplitude of the input signal pulse or level.

It is another object to provide an improved timing circuit which provides a highly accurate and stable delay between output and input signals.

It is a further object to provide a timing circuit for accurately producing signal delays which are longer than can practically and economically be produced by a delay line.

It is still another object to provide a timing circuit for delaying solely the leading edge of an input pulse.

According to an illustrative example of the invention, there is provided a differential amplifier having first and second inputs and having an output. A timing circuit input terminal is coupled by means of a voltage divider network to a first or reference input of the differential amplifier. The timing circuit input terminal is also coupled through a resistor-capacitor integrator to a second or signal input terminal of the differential amplifier. An input pulse or level applied to the timing circuit input terminal establishes a proportionate reference voltage on the first or reference input of the differential amplifier. The input signal pulse also results in the application of a gradually increasing voltage to the second or signal input of the differential amplifier through the action of the integrator. When the voltage applied to the second or signal input of the amplifier equals the voltage applied to the first or reference input, the differential amplifier provides an output voltage transition. The output voltage transition occurs at a stable fixed time delay following the input voltage transition, over a very large range of the amplitude of the input signal pulse, because of the proportional relationship between the reference and time delayed signals applied to the two inputs of the differential amplifier.

In another aspect, the invention includes the above-described timing circuit in combination with a flip-flop multivibrator having set and reset inputs and having an output. The input of the above-described timing circuit is connected to the output of the multivibrator and the output of the timing circuit is connected to the reset input of the multivibrator. In operation, an input trigger pulse applied to the set input of the multivibrator results in the generation of an output pulse from the multivibrator having a duration determined by the integrator.

These and other objects and aspects of the invention will be apparent to those skilled in the art from the following more detailed description taken in conjunction with the appended drawings wherein.

Figure 1:
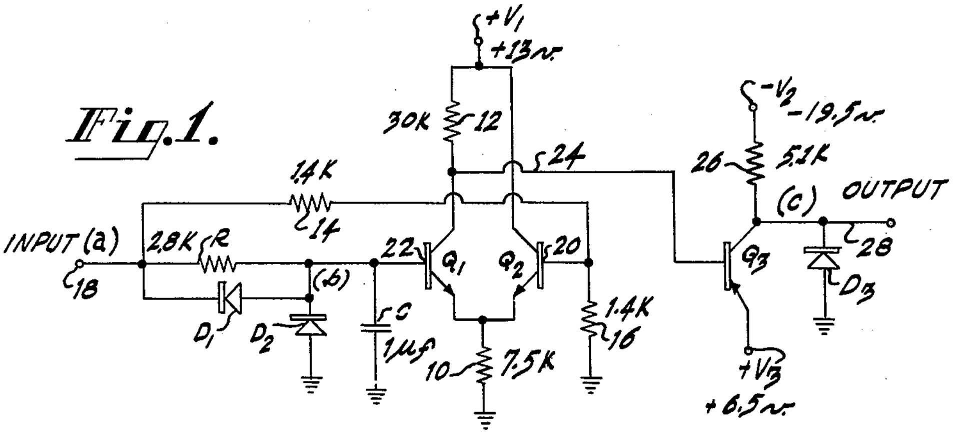
FIGURE 1 is a circuit diagram of a timing circuit constructed according to the teachings of this invention.

The timing circuit of FIGURE 1 includes two NPN transistors $Q_1$ and $Q_2$ which are connected to form a differential amplifier. The emitters of transistors $Q_1$ and $Q_2$ are connected together and through an emitter resistor 10 to a point of reference potential. The collector of transistor $Q_1$ is connected through an output resistor 12 to a point $+V_1$ of positive voltage relative to the reference voltage. The collector of transistor $Q_2$ is connected directly to the positive voltage terminal $+V_1$.

A voltage divider including resistors 14 and 16 is coupled between the timing circuit input terminal 18 and the base input terminal 20 of transistor $Q_2$. A resistor-capacitor integrator, including resistor R and capacitor C, is coupled between the timing circuit input terminal 18 and the base input terminal 22 of the transistor $Q_1$. A unidirectional conducting device such as a diode $D_1$ is connected in shunt with the resistor R; and a second unidirectional conducting device such as a diode $D_2$ is connected in shunt with the capacitor C.

An output 24 from the differential amplifier is taken from the collector of the transistor $Q_1$ and applied to the base input terminal of a transistor $Q_3$ which is connected as a common emitter inverter and switching circuit. The circuit includes a $+V_3$ terminal from which a positive bias voltage is applied to the emitter of the PNP transistor $Q_3$, and an output resistor 26 connected from the collector of the transistor $Q_3$ to a bias voltage terminal $-V_2$. The output 28 of the timing circuit of FIGURE 1 is prevented from falling below a reference potential by means of a clamping diode $D_3$.

Figure 2:
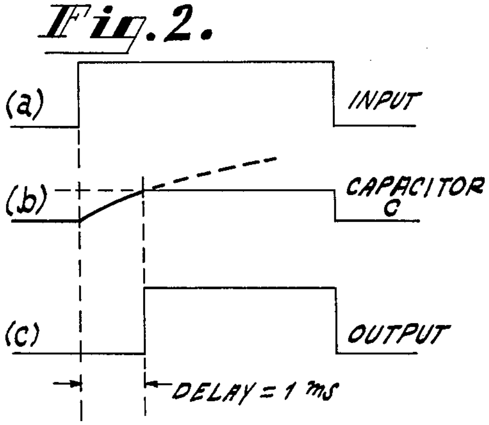
FIGURE 2 is a chart of voltage waveforms which will be referred to in describing the operation of the circuit of FIGURE 1.

The operation of the circuit of FIGURE 1 will be described with reference also to the voltage waveforms of FIGURE 2. The transistors $Q_1$, $Q_2$ and $Q_3$ are biased to be cut-off or substantially nonconducting in the absence of an input signal at the input terminal 18 (i.e., when the input is at ground or a negative potential). When a positive input pulse, as represented by waveform *a* of FIGURE 2, is applied to the input terminal 18, a proportion of the input pulse voltage is applied to the input base electrode 20 of the transistor $Q_2$. The proportion is determined by the values of the voltage divider resistors 14 and 16. By way of example, the resistors 14 and 16 may be equal in value, with the result that the voltage applied to the base of transistor $Q_2$ is equal to half the voltage of the input pulse. The base 20 of the transistor $Q_2$ is the reference voltage input of the differential amplifier including transistors $Q_1$ and $Q_2$. The proportional reference voltage applied to the base of transistor $Q_2$ causes the transistor $Q_2$ to conduct heavily so that a voltage drop is developed across the emitter resistor 10 which biases the emitters of both transistors $Q_1$ and $Q_2$ at a positive value such as 3½ volts. This emitter bias maintains the other transistor $Q_1$ in the cut-off or substantially nonconducting condition.

When the positive input pulse is applied to the input terminal 18, there is also a flow of current through the resistor R into the capacitor C of the resistor-capacitor integrator R, C. The voltage on the capacitor C builds up exponentially in the manner shown by the waveform *b* of FIGURE 2. The voltage on the capacitor C rises exponentially toward the voltage of the input pulse. When the voltage on the capacitor C equals and exceeds the half-value reference voltage applied to the base 20 of the transistor $Q_2$, the transistor $Q_1$ becomes conductive also. When the transistor $Q_1$ becomes conducting, a negative voltage transition is generated at the output 24, and is applied to the base of transistor $Q_3$. This causes transistor $Q_3$ to switch to the conducting state and generate a positive output voltage at the output 28, as represented by the voltage waveform *c* of FIGURE 2. The transistor $Q_3$ provides power gain, steepens the rising and falling edges of the output waveform, and establishes the output voltage levels at ground and +6.5 volts.

At the trailing edge of the input pulse applied to the input terminal 18, the voltages applied to the bases 20 and 22 of transistor $Q_2$ and $Q_1$ are reduced with the result that the transistors return to their cut-off or substantially nonconducting states. When transistor $Q_1$ is thus cut-off, it supplies a positive signal from the output 24 to the base of transistor $Q_3$, causing transistor $Q_3$ to also return to its nonconducting condition. It is thus seen that the trailing edge of the output pulse at output terminal 28 and as represented by the output waveform *c* of FIGURE 2 substantially coincides in time with the trailing edge of the input pulse applied to input terminal 18 and as shown by waveform *a* of FIGURE 2.

When the transistor $Q_1$ is cut-off by the trailing edge of the input pulse, the capacitor C rapidly discharges through the diode $D_1$. The diode $D_2$ prevents the voltage on the capacitor C from falling below the ground or reference potential.

It is thus seen that the timing circuit of FIGURE 1 provides an output pulse having a leading edge delayed a predetermined amount relative to the leading edge of the input pulse, and that the output pulse has a trailing edge substantially coincident with the trailing edge of the input pulse. The time delay between the leading edge of the input pulse and the leading edge of the output pulse, as illustrated in FIGURE 2, is determined by the values of resistance R and capacitance C in the integrator circuit. Solely by way of example, a circuit constructed with values of circuit elements as marked on FIGURE 1 provides a delay of 1 millisecond. Transistors $Q_1$ and $Q_2$ may be Type 2N1605, transistor $Q_3$ may be Type 2N404, and diodes $D_1$, $D_2$ and $D_3$ may be Type 1N97.

Figure 3:
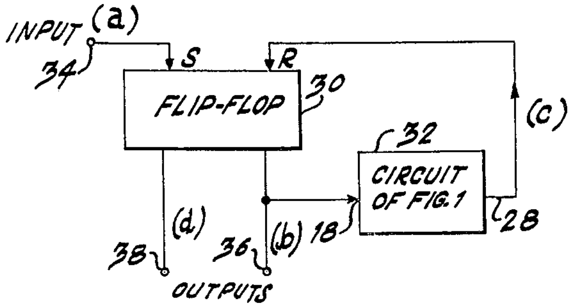
FIGURE 3 is a block diagram of a timing system including the circuit of FIGURE 1 in combination with a conventional flip-flop multivibrator.

FIGURE 3 shows a flip-flop or bistable multivibrator 30 connected with the circuit 32 of FIGURE 1 in such a way as to provide an output pulse having a duration determined by the integrator in the circuit of FIGURE 1, in response to the application of an input trigger pulse to the input of the multivibrator 30. The multivibrator 30 has a set input S connected to a trigger pulse terminal 34. The multivibrator 30 also has a reset input R, and two output terminals 36 and 38. The output terminal 36 of the multivibrator 30 is connected to the input terminal 18 of the circuit of FIGURE 1. The output terminal 28 of the circuit of FIGURE 1 is connected to the reset input terminal R of the multivibrator 30. The multivibrator 30 may be any suitable known bistable multivibrator, preferably of the transistor type. Vacuum tube or other type of flip-flops may be used with appropriate voltage level changes, if necessary connected between the flip-flop and circuit 32.

Figure 4:
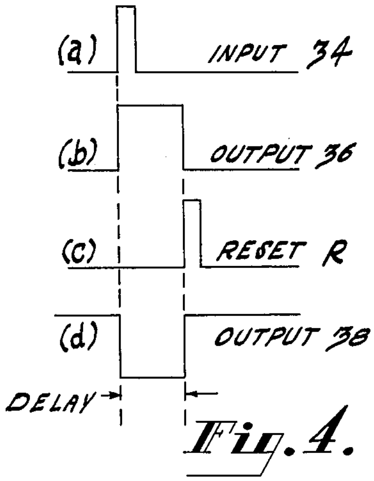
FIGURE 4 is a chart of voltage waveforms which will be referred to in describing the operation of the system of FIGURE 3.

The operation of the system of FIGURE 3 will now be described with reference to the voltage waveforms of FIGURE 4. An input trigger pulse, as shown by waveform *a* of FIGURE 4, is applied to the input terminal 34 and the set input S of the multivibrator 30. This causes a positive voltage pulse *b* of FIGURE 4 to appear at the output terminal 36 of the multivibrator 30 and to be applied to the input 18 of the circuit 32 of FIGURE 1. After a time delay determined by the time constant of the R-C integrator in the circuit of FIGURE 1, a positive output pulse *c* of FIGURE 4 is applied from the circuit 32 to the reset input R of the multivibrator 30. The multivibrator 30 is thus reset causing the termination of the output pulse *b* of FIGURE 4 at the multivibrator output terminal 36. A similar but opposite polarity output pulse *d* of FIGURE 4 is available at the multivibrator output terminal 38.

It is thus seen that, in response to an input trigger pulse applied to the input terminal 34, there is produced an output pulse at the output terminal 36 which has a duration determined by the time constant of the integrator in the circuit 32 of FIGURE 1.

What is claimed is:

1. A timing circuit comprising a signal input terminal, a differential amplifier having two inputs and an output, voltage divider means coupled between said signal input terminal and one of said differential amplifier inputs to apply a proportion of an input signal as a reference signal to said one input of the differential amplifier, and an integrator coupled between said signal input terminal and the other input of said differential amplifier, said differential amplifier providing an output when the integrated input signal equals the reference signal.

2. A timing circuit comprising a pulse signal input terminal, a differential amplifier having two inputs and an output, voltage dvider means coupled between said signal input terminal and one of said differential amplifier inputs to apply a proportion of an input signal as a reference signal to said one input of the differential amplifier, and a resistor-capacitor integrator coupled between said signal input terminal and the other input of said differential amplifier, said differential amplifier providing an output when the integrated input signal equals the reference signal.

3. A timing circuit comprising a pulse signal input terminal, a transistor differential amplifier having two inputs and an output, voltage divider means coupled between said signal input terminal and one of said differential amplifier inputs to apply a proportion of an input signal as a reference signal to said one input of the differential amplifier, and a resistor-capacitor integrator coupled between said signal input terminal and the other input of said differential amplifier, said differential amplifier providing an output when the integrated input signals equals the reference signal.

4. A timing circuit as defined in claim 3, and in addition, a common emitter switching circuit coupled to the output of said differential amplifier.

5. A timing circuit comprising a pulse signal input terminal, a differential amplifier having two inputs and an output, voltage divider means coupled between said signal input terminal and one of said differential amplifier inputs to apply a proportion of an input signal as a reference signal to said one input of the differential amplifier, a resistor-capacitor integrator coupled between said signal input terminal and the other input of said differential amplifier, said differential amplfier providing an output when the integrated input signal equals the reference signal, and unidirectional conduction means connected to said integrator to rapidly discharge said capacitor at the trailing edge of the input signal pulse.

6. A timing circuit as defined in claim 5, and an additional unidirectional conduction means connected to said integrator to prevent the voltage on said capacitor from falling to a value below a predetermined reference value.

7. A timing circuit comprising a flip-flop multivibrator having set and reset inputs and having an output, a differential amplifier having two inputs and an output, voltage divider means coupled between the output of said multivibrator and one of the inputs of said differential amplifier to apply a proportion of the output of the multivibrator as a reference signal to the differential amplifier, and an integrator coupled between the output of the multivibrator and the other input of the differential amplifier, said differential amplifier providing an output when the integrated signal on one input equals the reference signal on the other input of the amplifier, and means coupling the output of the differential amplifier to the reset input of the multivibrator, whereby the output of the multivibrator is a pulse having a duration determined by the time constant of said integrator.

No references cited.